United States Patent
Song

(10) Patent No.: US 12,057,155 B2
(45) Date of Patent: Aug. 6, 2024

(54) ELECTRONIC DEVICES FOR PERFORMING A POST-WRITE OPERATION AND ELECTRONIC SYSTEMS

(71) Applicant: SK hynix Inc., Icheon-si (KR)

(72) Inventor: Choung Ki Song, Icheon-si (KR)

(73) Assignee: SK hynix inc., Icheon-si (KR)

( * ) Notice: Subject to any disclaimer, the term of this patent is extended or adjusted under 35 U.S.C. 154(b) by 216 days.

(21) Appl. No.: 17/733,162

(22) Filed: Apr. 29, 2022

(65) Prior Publication Data

US 2023/0215482 A1 Jul. 6, 2023

(30) Foreign Application Priority Data

Jan. 4, 2022 (KR) .................. 10-2022-0001198

(51) Int. Cl.
| | | |
|---|---|---|
| G11C 11/24 | (2006.01) | |
| G11C 11/406 | (2006.01) | |
| G11C 11/408 | (2006.01) | |
| G11C 11/4094 | (2006.01) | |
| G11C 11/4096 | (2006.01) | |

(52) U.S. Cl.
CPC ........ *G11C 11/406* (2013.01); *G11C 11/4085* (2013.01); *G11C 11/4094* (2013.01); *G11C 11/4096* (2013.01)

(58) Field of Classification Search
CPC .............. G11C 11/406; G11C 11/4085; G11C 11/4094; G11C 11/4096; G11C 7/1093; G11C 7/1096; G11C 8/12; G11C 11/40611; G11C 2207/2227; G11C 11/4076; G11C 11/40603; G11C 11/4087; G11C 11/40618; G11C 11/408
USPC ......................................................... 365/149
See application file for complete search history.

(56) References Cited

U.S. PATENT DOCUMENTS

| | | | |
|---|---|---|---|
| 6,324,110 B1 * | 11/2001 | Leung .................. | G11C 7/1069 365/207 |
| 7,043,599 B1 | 5/2006 | Ware et al. | |
| 7,200,062 B2 * | 4/2007 | Kinsely ............. | G11C 11/40622 365/194 |
| 7,565,480 B2 * | 7/2009 | Ware ................. | G11C 11/40603 711/105 |
| 10,650,899 B2 * | 5/2020 | Alam .................. | G11C 11/4076 |

FOREIGN PATENT DOCUMENTS

KR 100752639 B1 8/2007

* cited by examiner

*Primary Examiner* — Tha-O H Bui
(74) *Attorney, Agent, or Firm* — WILLIAM PARK & ASSOCIATES LTD.

(57) ABSTRACT

An electronic system includes a controller configured to detect a bank in a standby state for a write operation between a first bank and a second bank during a refresh operation period and output data for performing a post-write operation to the bank in the standby state for the write operation. The electronic system also includes an electronic device including the first and second banks. The electronic device is configured to latch the data in an input/output control circuit connected to the bank in the standby state for the write operation.

20 Claims, 17 Drawing Sheets

ELECTRONIC DEVICES FOR PERFORMING A POST-WRITE OPERATION AND ELECTRONIC SYSTEMS

CROSS-REFERENCE TO RELATED APPLICATIONS

The present application claims priority under 35 U.S.C. 119(a) to Korean Patent Application No. 10-2022-0001198, filed on Jan. 4, 2022, which is incorporated herein by reference in its entirety.

BACKGROUND

1. Technical Field

Embodiments of the present disclosure relate to electronic devices and electronic systems performing a write operation during a refresh operation.

2. Related Art

A semiconductor device includes a plurality of cell arrays for storing data, and each of the plurality of cell arrays includes a plurality of cells. Each of the cells includes a cell capacitor and a cell transistor. The semiconductor device stores data through an operation of charging or discharging electric charges in or from the cell capacitor, and the amount of electric charge stored in the cell capacitor should ideally always be constant. However, in reality, the amount of electric charge stored in the cell capacitor is changed due to a voltage difference with a peripheral circuit. The electric charge may flow out while the cell capacitor is charged, or may flow in while the cell capacitor is discharged. As such, the change in the amount of electric charge of the cell capacitor means that the data stored in the cell capacitor is changed, which means that the stored data is lost. Accordingly, the semiconductor device performs a refresh operation to prevent data loss as described above.

SUMMARY

According to an embodiment of the present disclosure, an electronic system includes a controller configured to detect a bank in a standby state for a write operation between a first bank and a second bank during a refresh operation period, and output data for performing a post-write operation to the bank in the standby state for the write operation. The electronic system also includes an electronic device including the first and second banks. The electronic device is configured to latch the data in an input/output control circuit connected to the bank in the standby state for the write operation.

According to another embodiment of the present disclosure, an electronic system includes a controller configured to output a command for performing a post-write operation and data for performing the post-write operation during a refresh operation period and output a command for performing a core write operation after the refresh operation period. The electronic system also includes an electronic device configured to latch the data in an input/output circuit connected to a bank performing the post-write operation, based on the command during the refresh operation period and store the latched data in the bank after the refresh operation period.

According to a further embodiment of the present disclosure, an electronic system includes a controller configured to detect a bank in a standby state for a write operation, output a command and data for performing a post-write operation during a refresh operation period, and output a command for performing a core write operation to the bank in the standby state for the write operation after the refresh operation period has ended. The electronic system also includes an electronic device configured to latch the data to an input/output control circuit connected to the bank in the standby state for the write operation when the post-write operation is performed, based on the command during the refresh operation period, and store the data latched in the input/output control circuit in the bank in the standby state for the write operation, based on the command when the core write operation is performed.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period over which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
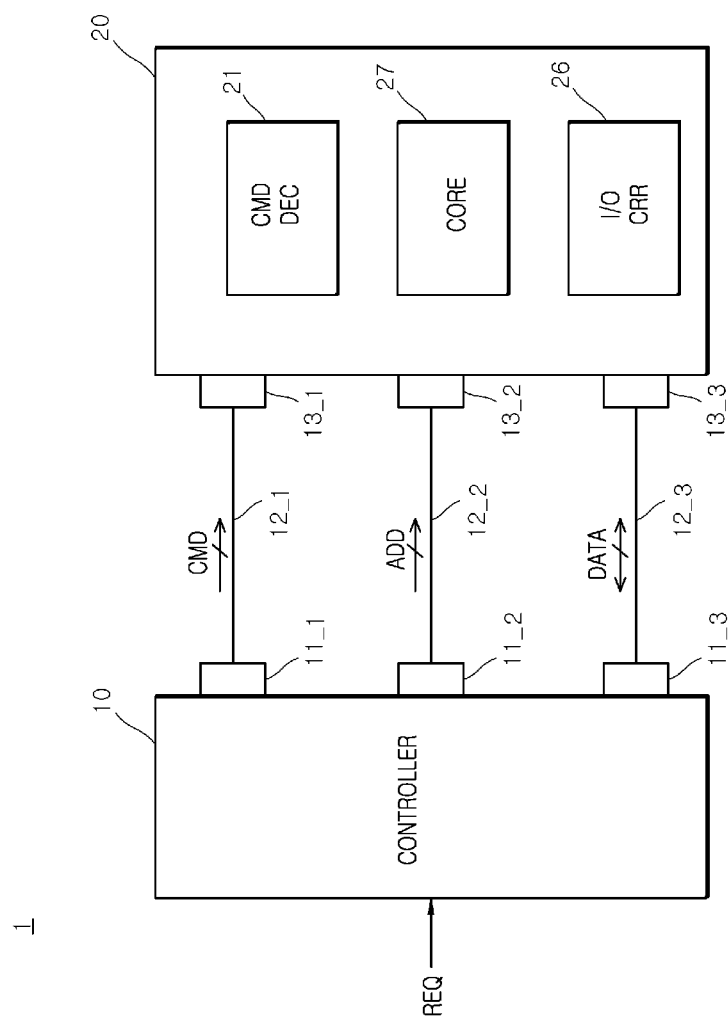
FIG. 1 is a block diagram illustrating a configuration of an electronic system according to an embodiment of the present disclosure.

FIG. 1 is a block diagram illustrating a configuration of an electronic system 1 according to an embodiment of the present disclosure. As illustrated in FIG. 1, the electronic system 1 may include a controller 10 and an electronic device 20.

The controller 10 may include a first control pin 11_1, a second control pin 11_2, and a third control pin 11_3. The electronic device 20 may include a first device pin 13_1, a second device pin 13_2, and a third device pin 13_3.

The controller 10 may transmit a command CMD to the electronic device 20 through a first transmission line 12_1 connected between the first control pin 11_1 and the first device pin 13_1. Each of the first control pin 11_1, the first transmission line 12_1, and the first device pin 13_1 may be implemented in a plural number according to the number of bits of the command CMD. The controller 10 may transmit an address ADD to the electronic device 20 through a second transmission line 12_2 connected between the second control pin 11_2 and the second device pin 13_2. Each of the second control pin 11_2, the second transmission line 12_2, and the second device pin 13_2 may be implemented in a plural number according to the number of bits of the address ADD. The controller 10 may output data DATA to the electronic device 20 or may receive data DATA from the electronic device 20 through a third transmission line 12_3 connected between the third control pin 11_3 and the third device pin 13_3. Each of the third control pin 11_3, the third transmission line 12_3, and the third device pin 13_3 may be implemented in a plural number according to the number of bits of the data DATA.

The controller 10 may output a command CMD for performing a refresh operation during a refresh operation period. The controller 10 may detect a bank on which a write operation can be performed among a plurality of banks included in a core region 27 of the electronic device 20 during the refresh operation period. For an embodiment, the banks represent memory banks. The controller 10 may output a command CMD, an address ADD, and data DATA for performing a post-write operation to the bank on which the write operation can be performed during the refresh operation period. The controller 10 may output a command CMD and an address ADD for performing a core write operation to the bank on which the post-write operation is performed after the refresh operation period. The controller 10 may output a command CMD and an address ADD for performing a normal operation, and may input and output data DATA. The commands CMD for performing the refresh operation, the post-write operation, the core write operation, and the normal operation may be set to have different logic level combinations.

The electronic device 20 may include a command decoder 21, an input/output control circuit 26, and the core region 27.

The command decoder 21 may decode the command CMD to generate a refresh signal (REF of FIG. 5) for performing a refresh operation. The command decoder 21 may decode the command CMD to generate a post-write signal (PWR of FIG. 5) for performing a post-write operation. The command decoder 21 may decode the command CMD to generate a core write signal (CWR of FIG. 5) for performing a core write operation. The command decoder 21 may decode the command CMD to generate a write signal (WT of FIG. 5) for performing a write operation of a normal operation. The command decoder 21 may decode the command CMD to generate a read signal (RD of FIG. 5) for performing a read operation of the normal operation.

The input/output control circuit 26 may latch the data DATA during a post-write operation. The input/output control circuit 26 may latch the data DATA to a write driver (261 of FIG. 6) connected to the bank on which the post-write operation is performed to generate latch data (LD of FIG. 7). The input/output control circuit 26 may store the latch data (LD of FIG. 7) latched to the write driver (261 of FIG. 6) in first to fourth banks (BK1, BK2, BK3, and BK4 of FIG. 5) included in the core region 27 during the core write operation.

Figure 5:
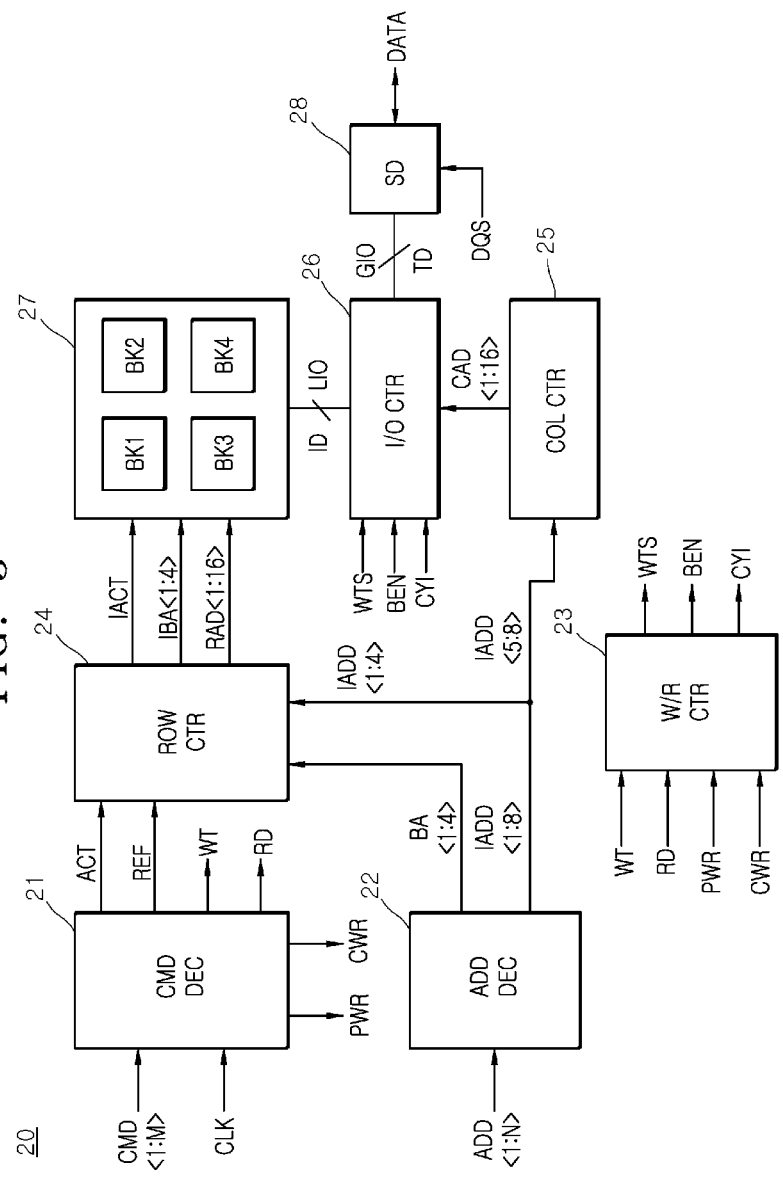
FIG. 5 is a block diagram illustrating a configuration of an electronic device included in the electronic system illustrated in FIG. 1.

The core region 27 may include the first to fourth banks (BK1, BK2, BK3, and BK4 of FIG. 5). The core region 27 may sequentially perform refresh operations on the first to fourth banks (BK1, BK2, BK3, and BK4 of FIG. 5) during a refresh operation period. The core region 27 may store the latch data (LD of FIG. 7) latched in the write driver (261 of FIG. 6), in which the post-write operation is performed during the core write operation after the refresh operation period. The core region 27 may store the data DATA in a bank selected from among the first to fourth banks (BK1, BK2, BK3, and BK4 of FIG. 5) during a write operation period. The core region 27 may output the data DATA stored in the bank selected from among the first to fourth banks (BK1, BK2, BK3, and BK4 of FIG. 5) during a read operation during the normal operation period.

The electronic device 20 may sequentially perform refresh operations on the first to fourth banks (BK1, BK2, BK3, and BK4 of FIG. 5) during the refresh operation period. The electronic device 20 may perform the post-write operation on the bank selected from among the first to fourth banks (BK1, BK2, BK3, and BK4 of FIG. 5) during the refresh operation period to latch the data DAT in the write driver (261 of FIG. 6). The electronic device 20 may perform a core write operation on the bank selected from among the first to fourth banks (BK1, BK2, BK3, and BK4 of FIG. 5) after the refresh operation period to store the data DAT latched during the post-write operation. The electronic device 20 may store the data DATA in the bank selected from among the first to fourth banks (BK1, BK2, BK3, and BK4 of FIG. 5) during the write operation of the normal operation. The electronic device 20 may output the data DATA stored in the bank selected from among the first to fourth banks (BK1, BK2, BK3, and BK4 of FIG. 5) during the read operation of the normal operation.

Figure 2:
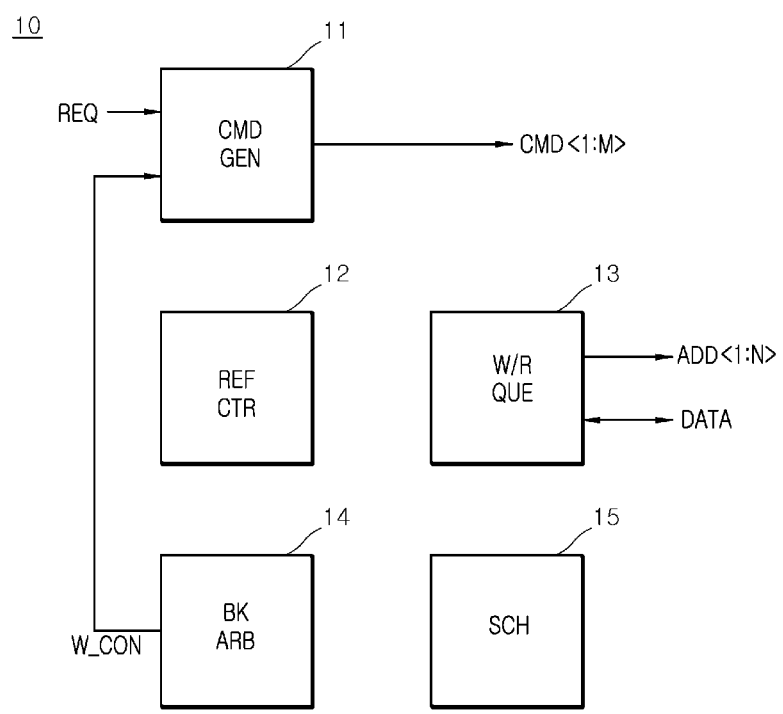
FIG. 2 is a block diagram illustrating a configuration of a controller included in the electronic system illustrated in FIG. 1.

FIG. 2 is a block diagram illustrating a configuration of the controller 10 included in the electronic system 1. The controller 10 may include a command generation circuit 11, a refresh control circuit 12, a write read queue circuit 13, a bank arbiter 14, and a scheduler 15.

The command generation circuit 11 may generate first to $M^{th}$ commands CMD<1:M> for performing various operations by a request REQ of an external device (e.g., host). The command generation circuit 11 may generate the first to $M^{th}$ commands CMD<1:M> for performing the post-write operation during a refresh operation period when the write control signal W_CON is disabled. The command generation circuit 11 may generate the first to $M^{th}$ commands CMD<1:M> for performing the core write operation after the refresh operation period when the write control signal W_CON is disabled. The command generation circuit 11 may generate the first to $M^{th}$ commands CMD<1:M> for performing the normal operation when the write control signal W_CON is enabled. Although the request REQ is illustrated as one signal, the request REQ may be input from an external device (e.g., host) including various information for performing the refresh operation, the post-write operation, the core write operation, and the normal operation for the electronic device 20.

The refresh control circuit 12 may set the refresh operation period. The refresh control circuit 12 may control the command generation circuit 11 to adjust a generation cycle of the first to $M^{th}$ commands CMD<1:M>.

The write read queue circuit 13 may output first to $N^{th}$ addresses ADD<1:N> and data DATA for performing the post-write operation. The write read queue circuit 13 may output the first to $N^{th}$ addresses ADD<1:N> for performing the core write operation. The write read queue circuit 13 may output the first to $N^{th}$ addresses ADD<1:N> and the data DATA for performing the write operation of the normal operation. The write read queue circuit 13 may output the first to $N^{th}$ addresses ADD<1:N> for performing the read operation of the normal operation and may receive the data DATA.

The bank arbiter 14 may detect a bank on which a write operation can be performed among the first to fourth banks BK1, BK2, BK3, and BK4 of FIG. 5 during the refresh operation period. The bank arbiter 14 may store first to fourth flag signals (FLAG1, FLAG2, FLAG3, and FLAG4 of FIG. 4) corresponding to the first to fourth banks BK1, BK2, BK3, and BK4 of FIG. 5 on which a write operation can be performed during the refresh period. A method of detecting the bank on which a write operation can be performed among the first to fourth banks BK1, BK2, BK3, and BK4 of FIG. 4 by the bank arbiter 14 may be variously set according to embodiments.

The scheduler 15 may control an operation order of the write operation and the read operation of the normal operation. The scheduler 15 may control the write read queue circuit 13 to select the bank for performing the write operation and the read operation among the first to fourth banks BK1, BK2, BK3, and BK4 of FIG. 5 in the normal operation.

Figure 3:
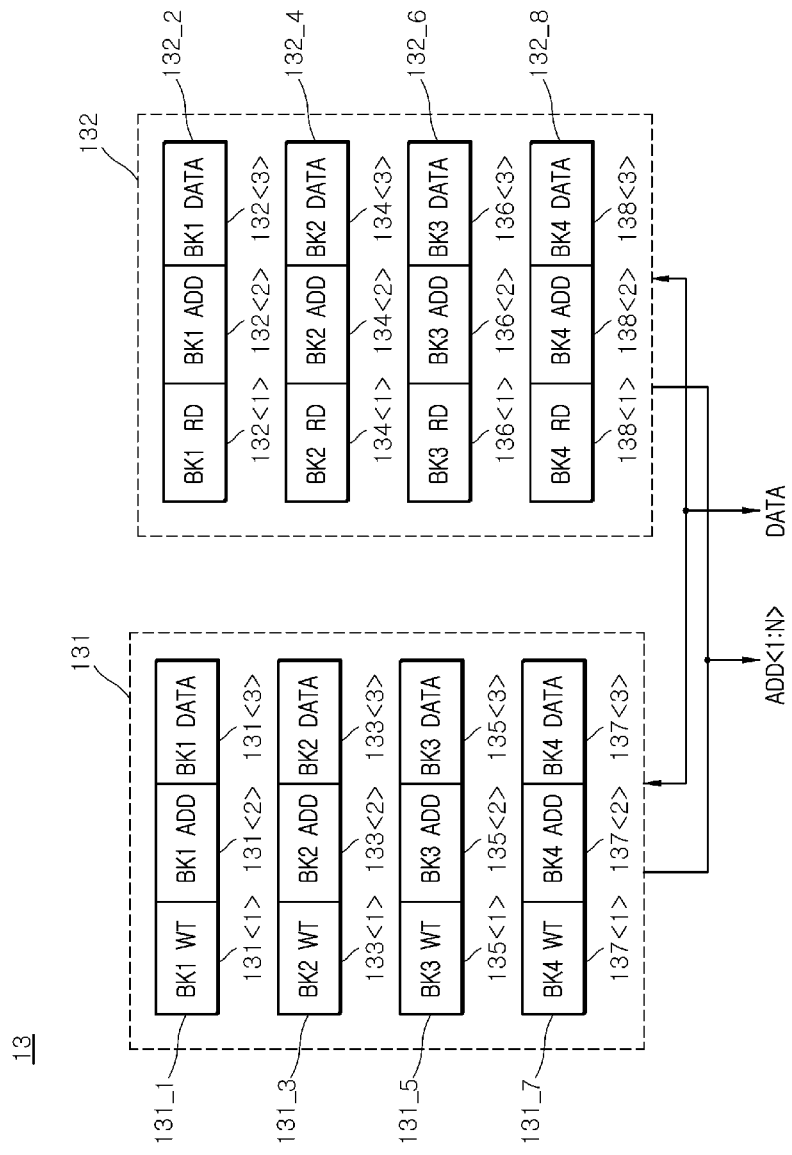
FIG. 3 is a block diagram illustrating a configuration of a write read queue circuit included in the controller illustrated in FIG. 2.

FIG. 3 is a block diagram illustrating a configuration of the write read queue circuit 13 included in the controller 10. The write read queue circuit 13 may include a write queue circuit 131 and a read queue circuit 132.

The write queue circuit 131 may include a first write queue circuit 131_1, a second write queue circuit 131_3, a third write queue circuit 131_5, and a fourth write queue circuit 131_7.

The first write queue circuit 131_1 may include a first bank write detection circuit 131<1>, a first bank write address generation circuit 131<2>, and a first bank data output circuit 131<3>. The first bank write detection circuit 131<1> may detect a write operation standby for the first bank (BK1 of FIG. 5). The first bank write address generation circuit 131<2> may output first to $N^{th}$ addresses ADD<1:N> for performing a post write operation, a core write operation, and a write operation on the first bank (BK1 of FIG. 5). The first bank data output circuit 131<3> may output data DATA for performing the post write operation and the write operation on the first bank (BK1 of FIG. 5).

The second write queue circuit 131_3 may include a second bank write detection circuit 133<1>, a second bank write address generation circuit 133<2>, and a second bank data output circuit 133<3>. The second bank write detection circuit 133<1> may detect a write operation standby for the second bank (BK2 of FIG. 5). The second bank write address generation circuit 133<2> may output first to $N^{th}$ addresses ADD<1:N> for performing a post write operation, a core write operation, and a write operation on the second bank (BK2 of FIG. 5). The second bank data output circuit 133<3> may output data DATA for performing the post write operation and the write operation on the second bank (BK2 of FIG. 5).

The third write queue circuit 131_5 may include a third bank write detection circuit 135<1>, a third bank write address generation circuit 135<2>, and a third bank data output circuit 135<3>. The third bank write detection circuit 135<1> may detect a write operation standby for the third bank (BK3 of FIG. 5). The third bank write address generation circuit 135<2> may output first to $N^{th}$ addresses ADD<1:N> for performing a post write operation, a core write operation, and a write operation on the third bank (BK3 of FIG. 5). The third bank data output circuit 135<3> may output data DATA for performing the post write operation and the write operation on the third bank (BK3 of FIG. 5).

The fourth write queue circuit 131_7 may include a fourth bank write detection circuit 137<1>, a fourth bank write address generation circuit 137<2>, and a fourth bank data output circuit 137<3>. The fourth bank write detection circuit 137<1> may detect a write operation standby for the fourth bank (BK4 of FIG. 5). The fourth bank write address generation circuit 137<2> may output first to $N^{th}$ addresses ADD<1:N> for performing a post write operation, a core write operation, and a write operation on the fourth bank (BK4 of FIG. 5). The fourth bank data output circuit 137<3> may output data DATA for performing the post write operation and the write operation on the fourth bank (BK4 of FIG. 5).

The read queue circuit 132 may include a first read queue circuit 132_2, a second read queue circuit 132_4, a third read queue circuit 132_6, and a fourth read queue circuit 132_8.

The first read queue circuit 132_2 may include a first bank read detection circuit 132<1>, a first bank read address generation circuit 132<2>, and a first bank data input circuit 132<3>. The first bank read detection circuit 132<1> may detect a read operation standby for the first bank (BK1 of FIG. 5). The first bank read address generation circuit 132<2> may output first to $N^{th}$ addresses ADD<1:N> for performing a read operation on the first bank (BK1 of FIG. 5). The first bank data input circuit 132<3> may receive data DATA during the read operation on the first bank (BK1 of FIG. 5) and output the received data DATA to an external device (e.g., host).

The second read queue circuit 132_4 may include a second bank read detection circuit 134<1>, a second bank read address generation circuit 134<2>, and a second bank data input circuit 134<3>. The second bank read detection circuit 134<1> may detect a read operation standby for the second bank (BK2 of FIG. 5). The second bank read address generation circuit 134<2> may output first to $N^{th}$ addresses ADD<1:N> for performing a read operation on the second bank (BK2 of FIG. 5. The second bank data input circuit 134<3> may receive data DATA during the read operation on the second bank (BK2 of FIG. 5) and output the received data DATA to the external device (e.g., host).

The third read queue circuit 132_6 may include a third bank read detection circuit 136<1>, a third bank read address generation circuit 136<2>, and a third bank data input circuit 136<3>. The third bank read detection circuit 136<1> may detect a read operation standby for the third bank (BK3 of FIG. 5). The third bank read address generation circuit 136<2> may output first to $N^{th}$ addresses ADD<1:N> for performing a read operation on the third bank (BK3 of FIG. 5). The third bank data input circuit 136<3> may receive data DATA during the read operation on the third bank (BK3 of FIG. 5) and output the received data DATA to the external device (e.g., host).

The fourth read queue circuit 132_8 may include a fourth bank read detection circuit 138<1>, a fourth bank read address generation circuit 138<2>, and a fourth bank data input circuit 138<3>. The fourth bank read detection circuit 138<1> may detect a read operation standby for the fourth bank (BK4 of FIG. 5). The fourth bank read address generation circuit 138<2> may output first to $N^{th}$ addresses ADD<1:N> for performing a read operation on the fourth bank (BK4 of FIG. 5). The fourth bank data input circuit 138<3> may receive data DATA during the read operation on the fourth bank (BK4 of FIG. 5) and output the received data DATA to the external device (e.g., host).

Figure 4:
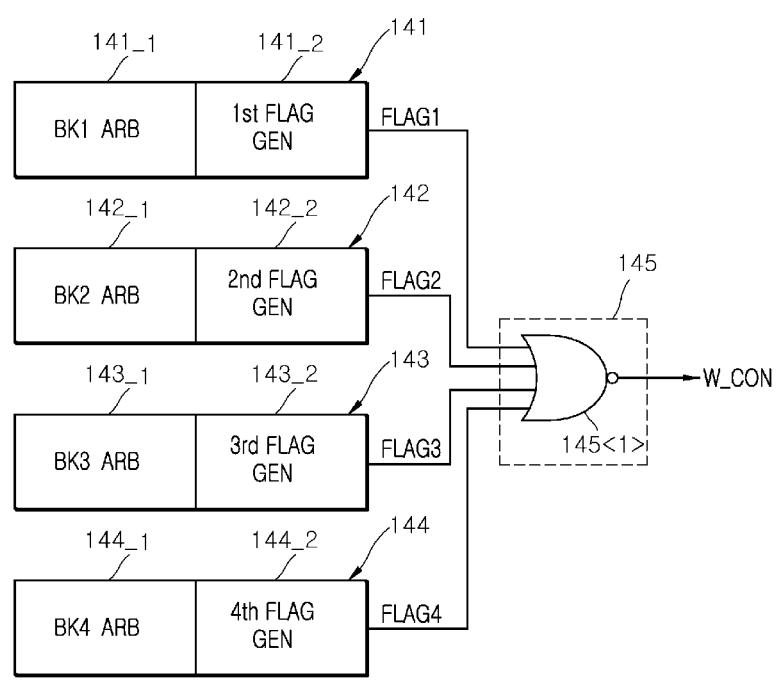
FIG. 4 is a block diagram illustrating a configuration of a bank arbiter included in the controller illustrated in FIG. 2.

FIG. 4 is a block diagram illustrating a configuration of the bank arbiter 14 included in the controller 10. Referring to FIG. 4, the bank arbiter 14 may include a first bank arbiter 141, a second bank arbiter 142, a third bank arbiter 143, a fourth bank arbiter 144, and a write control signal generation circuit 145.

The first bank arbiter 141 may include a first arbiter 141_1 and a first flag signal generation circuit 141_2. The first arbiter 141_1 may receive write operation standby information on the first bank (BK1 of FIG. 5) from the first write queue circuit 131_1 during a refresh operation period. The first arbiter 141_1 may detect whether a write operation on the first bank (BK1 of FIG. 5) is possible during the refresh operation period. The first flag signal generation circuit 141_2 may generate a first flag signal FLAG1 that is enabled to a logic "high" level when the first arbiter 141_1 detects a write operation standby for the first bank (BK1 of FIG. 5). The first flag signal generation circuit 141_2 may generate the first flag signal FLAG1 that is disabled to a logic "low" level when a refresh operation and a normal operation on the first bank (BK1 of FIG. 5) are performed in the first arbiter 141_1. The first flag signal generation circuit 141_2 may generate the first flag signal FLAG1 that is disabled to a logic "low" level when a core write operation is performed.

The second bank arbiter 142 may include a second arbiter 142_1 and a second flag signal generation circuit 142_2. The first arbiter 142_1 may receive write operation standby information on the second bank (BK2 of FIG. 5) from the second write queue circuit 131_3 during the refresh operation period. The second arbiter 142_1 may detect whether a write operation on the second bank (BK2 of FIG. 5) is possible during the refresh operation period. The second flag signal generation circuit 142_2 may generate a second flag signal FLAG2 that is enabled to a logic "high" level when the second arbiter 142_1 detects a write operation standby for the second bank (BK2 of FIG. 5). The second flag signal generation circuit 142_2 may generate the second flag signal FLAG2 that is disabled to a logic "low" level when a refresh operation and a normal operation on the second bank (BK2 of FIG. 5) are performed in the second arbiter 142_1. The second flag signal generation circuit 142_2 may generate the second flag signal FLAG2 that is disabled to a logic "low" level when the core write operation is performed.

The third bank arbiter 143 may include a third arbiter 143_1 and a third flag signal generation circuit 143_2. The third arbiter 143_1 may receive write operation standby information on the third bank (BK3 of FIG. 5) from the third write queue circuit 131_5 during the refresh operation period. The third arbiter 143_1 may detect whether a write operation on the third bank (BK3 of FIG. 5) is possible during the refresh operation period. The third flag signal generation circuit 143_2 may generate a third flag signal FLAG3 that is enabled to a logic "high" level when the third arbiter 143_1 detects a write operation standby for the third bank (BK3 of FIG. 5). The third flag signal generation circuit 143_2 may generate the third flag signal FLAG3 that is disabled to a logic "low" level when a refresh operation and a normal operation on the third bank (BK3 of FIG. 5) are performed in the third arbiter 143_1. The third flag signal generation circuit 143_2 may generate the third flag signal FLAG3 that is disabled to a logic "low" level when the core write operation is performed.

The fourth bank arbiter 144 may include a fourth arbiter 144_1 and a fourth flag signal generation circuit 144_2. The fourth arbiter 144_1 may receive write operation standby information on the fourth bank (BK4 of FIG. 5) from the fourth write queue circuit 131_7 during the refresh operation period. The fourth arbiter 144_1 may detect whether a write operation on the fourth bank (BK4 of FIG. 5) is possible during the refresh operation period. The fourth flag signal generation circuit 144_2 may generate a fourth flag signal FLAG4 that is enabled to a logic "high" level when the fourth arbiter 143_1 detects a write operation standby for the fourth bank (BK4 of FIG. 5). The fourth flag signal generation circuit 144_2 may generate the fourth flag signal FLAG4 that is disabled to a logic "low" level when a refresh operation and a normal operation on the fourth bank (BK4 of FIG. 5) are performed in the fourth arbiter 144_1. The fourth flag signal generation circuit 144_2 may generate the fourth flag signal FLAG4 that is disabled to a logic "low" level when the core write operation is performed.

The write control signal generation circuit 145 may be implemented with a NOR gate 145<1>. The write control signal generation circuit 145 may generate a write control signal W_CON, based on the first flag signal FLAG1, the second flag signal FLAG2, the third flag signal FLAG3, and the fourth flag signal FLAG4. The write control signal generation circuit 145 may perform a NOR operation on the first flag signal FLAG1, the second flag signal FLAG2, the third flag signal FLAG3, and the fourth flag signal FLAG4 to generate the write control signal W_CON. The write control signal generation circuit 145 may generate the write control signal W_CON that is enabled to a logic "high" level when all the first flag signal FLAG1, the second flag signal FLAG2, the third flag signal FLAG3, and the fourth flag signal FLAG4 are generated to a logic "low" level. The write control signal generation circuit 145 may generate the write control signal W_CON that is disabled to a logic "low" level when one of the first flag signal FLAG1, the second flag signal FLAG2, the third flag signal FLAG3, and the fourth flag signal FLAG4 is generated to a logic "high" level.

FIG. 5 is a block diagram illustrating a configuration according to an example of the electronic device 20 included in the electronic system 1 illustrated in FIG. 1. The electronic device 20 may include a command decoder 21, an address decoder 22, a write read control circuit 23, a row control circuit 24, a column control circuit 25, an input/output control circuit 26, a core region 27, and a serial-parallel conversion circuit 28.

The command decoder 21 may decode first to $M^{th}$ commands CMD<1:M> to generate an active signal ACT for performing an active operation. The command decoder 21 may decode the first to $M^{th}$ commands CMD<1:M> to generate a refresh signal REF for performing a refresh operation. The command decoder 21 may decode the first to $M^{th}$ commands CMD<1:M> to generate a post-write signal PWR for performing a post-write operation. The command decoder 21 may decode the first to $M^{th}$ commands CMD<1:M> to generate a core write signal CWR for performing a core write operation. The command decoder 21 may decode the first to $M^{th}$ commands CMD<1:M> to generate a write signal WT for performing a write operation. The command decoder 21 may decode the first to $M^{th}$ commands CMD<1:M> to generate a read signal RD for performing a read operation. The logic level combinations of the first to $M^{th}$ commands CMD<1:M> for generating the active signal ACT, the refresh signal REF, the post write signal PWR, the core write signal CWR, the write signal WT, and the read signal RD may be set to different logic level combinations.

The address decoder 22 may decode first to $N^{th}$ addresses ADD<1:N> to generate first to fourth bank addresses BA<1:4> and first to eighth internal addresses IADD<1:8>. The address decoder 22 may decode the first to $N^{th}$ addresses ADD<1:N> to generate the first to fourth bank addresses BA<1:4> for selecting first to fourth banks BK1, BK2, BK3, and BK4. The address decoder 22 may decode the first to $N^{th}$ addresses ADD<1:N> to generate the first to forth internal addresses IADD<1:4> for selecting a row path included in the first to fourth banks BK1, BK2, BK3, and BK4 and generate fifth to eighth internal addresses IADD<5:8> for selecting a column path included in the first to fourth banks BK1, BK2, BK3, and BK4.

The write read control circuit 23 may generate a write control signal WTS and a drive enable signal BEN that are enabled when the post-write signal PWR is input. The write read control circuit 23 may generate a column control signal CYI that is enabled when a core write signal CWR is input. The write read control circuit 23 may generate the write control signal WTS, the drive enable signal BEN, and the column control signal CYI that are enabled when the write signal WT is input. The write read control circuit 23 may generate the write control signal WTS that is disabled when the read signal RD is input and may generate the drive enable signal BEN and the column control signal CYI that are enabled when the read signal RD is input.

The row control circuit 24 may generate first to fourth internal bank addresses IBA<1:4> that are sequentially counted when a refresh signal REF is input, and generate first to sixteenth row addresses RAD<1:16> that are sequentially counted when the refresh signal REF is input. The row control circuit 24 may generate an internal active signal IACT that is enabled when the active signal ACT is input. The row control circuit 24 may generate the internal active signal IACT that is enabled when the active signal ACT is input, generate the first to fourth internal bank addresses IBA<1:4> from the first to fourth bank addresses BA<1:4>, and decode the first to fourth internal addresses IADD<1:4> to generate the first to sixteenth row addresses RAD<1:16>.

The column control circuit 25 may decode the fifth to eighth internal addresses IADD<5:8> to generate first to sixteenth column addresses CAD<1:16>.

The input/output control circuit 26 may latch transfer data TD that is loaded on a global line GIO by the write control signal WTS, the drive enable signal BEN, and the first to sixteenth column addresses CAD<1:16> during a post-write operation. The input/output control circuit 26 may output internal data ID generated from the transfer data TD latched by the write control signal WTS, the drive enable signal BEN, and the first to sixteenth column addresses CAD<1:16> during a core write operation through a local input/output line LIO. The input/output control circuit 26 may output the internal data ID generated from the transfer data TD loaded on a global input/output line GIO by the write control signal WTS, the drive enable signal BEN, the column control signal CYI, and the first to sixteenth column addresses CAD<1:16> during a write operation of the normal operation through the local input/output line LIO. The input/output control circuit 26 may output the transfer data TD that is generated by sensing and amplifying the internal data ID loaded on the local input/output line LIO by the write control signal WTS, the drive enable signal BEN, the column control signal CYI, and the first to sixteenth column addresses CAD<1:16> during a read operation of the normal operation through the global input/output line GIO.

The core region 27 may include the first bank BK1, the second bank BK2, the third bank BK3, and the fourth bank BK4.

The first bank BK1 may be activated when the first internal bank address IBA<1> is enabled during a refresh operation and may perform the refresh operation by the sequentially counted first to sixteenth row addresses RAD<1:16>. The first bank BK1 may be activated when the first internal bank address IBA<1> is enabled during a core write operation and a write operation of the normal operation and may store the internal data ID loaded on the local input/output line LIO via a row path selected by the first to sixteenth row addresses RAD<1:16>. The first bank BK1 may be activated when the first internal bank address IBA<1> is enabled during a read operation of the normal operation, and may output the internal data ID stored therein to the local input/output line LIO through a row path selected by the first to sixteenth row addresses RAD<1:16>.

The second bank BK2 may be activated when the second internal bank address IBA<2> is enabled during the refresh operation and may perform the refresh operation by the sequentially counted first to sixteenth row addresses RAD<1:16>. The second bank BK2 may be activated when the second internal bank address IBA<2> is enabled during the core write operation and the write operation of the normal operation and may store the internal data ID loaded on the local input/output line LIO via a row path selected by the first to sixteenth row addresses RAD<1:16>. The second bank BK2 may be activated when the second internal bank address IBA<2> is enabled during the read operation of the normal operation, and may output the internal data ID stored therein to the local input/output line LIO via the row path selected by the first to sixteenth row addresses RAD<1:16>.

The third bank BK3 may be activated when the third internal bank address IBA<3> is enabled during the refresh operation and may perform the refresh operation by the sequentially counted first to sixteenth row addresses RAD<1:16>. The third bank BK3 may be activated when the third internal bank address IBA<3> is enabled during the core write operation and the write operation of the normal operation and may store the internal data ID loaded on the local input/output line LIO via a row path selected by the first to sixteenth row addresses RAD<1:16>. The third bank BK3 may be activated when the third internal bank address IBA<3> is enabled during the read operation of the normal operation, and may output the internal data ID stored therein to the local input/output line LIO via the row path selected by the first to sixteenth row addresses RAD<1:16>.

The fourth bank BK4 may be activated when the fourth internal bank address IBA<4> is enabled during the refresh operation and may perform the refresh operation the sequentially counted first to sixteenth row addresses RAD<1:16>. The fourth bank BK4 may be activated when the fourth internal bank address IBA<4> is enabled during the core write operation and the write operation of the normal operation and may store the internal data ID loaded on the local input/output line LIO via a row path selected by the first to sixteenth row addresses RAD<1:16>. The fourth bank BK4 may be activated when the fourth internal bank address IBA<4> is enabled during the read operation of the normal operation, and may output the internal data ID stored therein to the local input/output line LIO via the row path selected by the first to sixteenth row addresses RAD<1:16>.

The first bank BK1, the second bank BK2, the third bank BK3, and the fourth bank BK4 may be implemented as general memory regions including a plurality of memory cells. The core region 27 may be implemented to include the first bank BK1, the second bank BK2, the third bank BK3, and the fourth bank BK4, but may be implemented to include various numbers of banks according to embodiments.

The serial-parallel conversion circuit 28 may output transfer data TD generated by sampling the data DATA in synchronization with a strobe signal DQS that is toggled during the post-write operation to the global input/output line GIO. The serial-parallel conversion circuit 28 may output the transfer data TD generated by parallelizing the data DATA input in series during the post-write operation to the global input/output line GIO. The serial-parallel conversion circuit 28 may output the transfer data TD generated by sampling the data DATA in synchronization with the strobe signal DQS that is toggled during the write operation to the global input/output line GIO. The serial-parallel conversion circuit 28 may output the transfer data TD generated by parallelizing the data DATA input in series during the write operation to the global input/output line GIO. The serial-parallel conversion circuit 28 may output the data DATA generated by sampling the transfer data TD loaded on the global input/output line GIO in synchronization with the strobe signal DQS that is toggled during the read operation to the controller 10. The serial-parallel conversion circuit 28 may output the data DATA generated by serializing the transfer data TD input in parallel during the read operation to the controller 10. The strobe signal DQS may be set as a signal that is toggled to sample the data DATA during the post-write operation, the write operation, and the read operation. The strobe signal DQS may be set as a signal that is not toggled during the core write operation.

Figure 6:
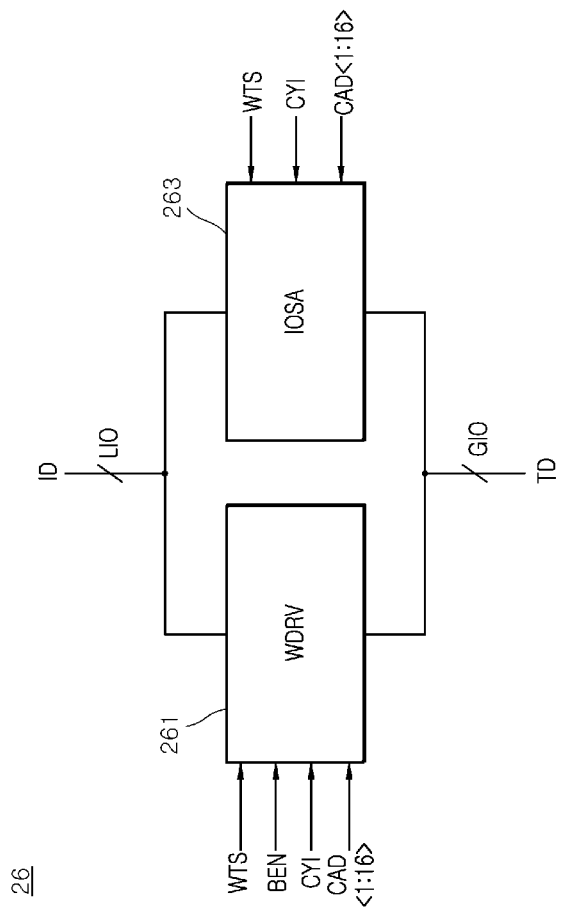
FIG. 6 is a block diagram illustrating a configuration of an input/output control circuit included in the electronic device illustrated in FIG. 5.

FIG. 6 is a block diagram illustrating a configuration of the input/output control circuit 26 included in the electronic device 20 illustrated in FIG. 5. The input/output control circuit 26 may include a write driver 261 and an input/output sense amplifier 263.

The write driver 261 may latch the transfer data TD loaded on the global input/output line GIO by the write control signal WTS, the drive enable signal BEN, and the first to sixteenth column addresses CAD<1:16> during the post-write operation. The write driver 261 may output the internal data ID generated from the transfer data TD latched by the write control signal WTS, the column control signal CYI, and the first to sixteenth column addresses CAD<1:16> during the core write operation to the local input/output line LIO. The write driver 261 may output the internal data ID generated from the transfer data TD loaded on the global input/output line GIO by the write control signal WTS, the column control signal CYI, and the first to sixteenth column addresses CAD<1:16> during the write operation of the normal operation to the local input/output line LIO.

The sense amplifier 263 may output the transfer data TD generated by sensing and amplifying the internal data ID loaded on the local input/output line LIO by the write control signal WTS, the column control signal CYI, and the first to sixteenth column addresses CAD<1:16> during the read operation of the normal operation to the global input/output line GIO.

Figure 7:
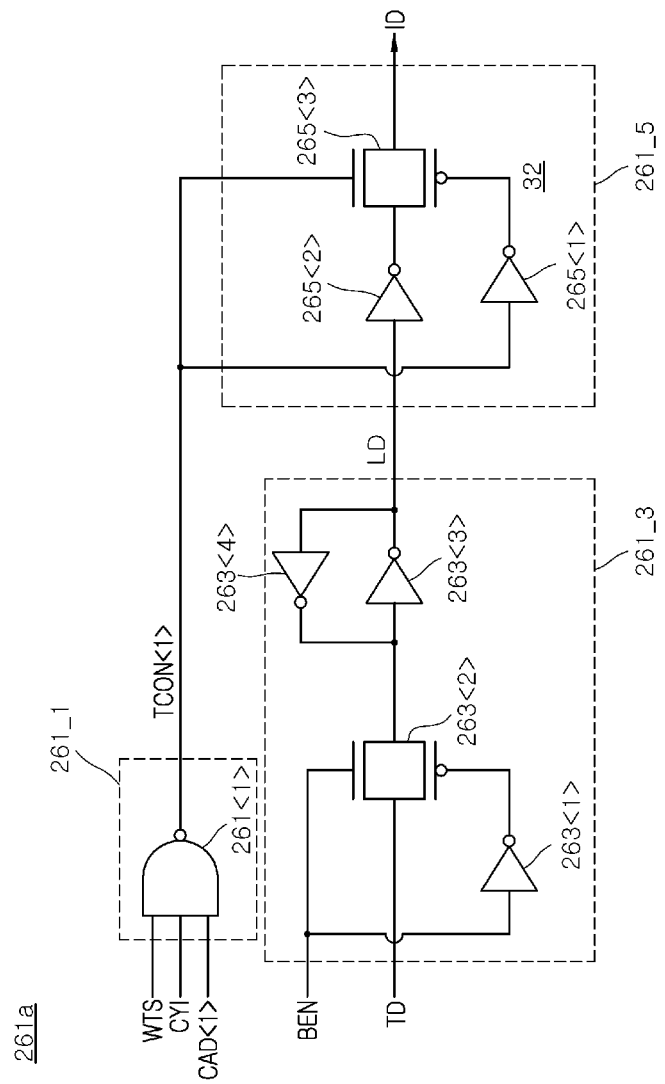
FIG. 7 is a circuit diagram illustrating a configuration of a first write driver included in a write driver illustrated in FIG. 6.

FIG. 7 is a circuit diagram illustrating a configuration of a first write driver 261a included in the write driver 261 illustrated in FIG. 6. The first write driver 261a may include a transfer signal generation circuit 261_1, a latch circuit 261_3, and a transfer circuit 261_5.

The transfer signal generation circuit 261_1 may be implemented with an AND gate 261<1>. The transfer signal generation circuit 261_1 may perform an AND operation on the write control signal WTS, the column control signal CYI, and the first column address CAD<1> to generate a first transfer control signal TCON<1>. The transfer signal generation circuit 261_1 may generate the first transfer control signal TCON<1> that is enabled to a logic "high" level when all of the write control signal WTS, the column control signal CYI, and the first column address CAD<1> are enabled to a logic "high" level.

The latch circuit 261_3 may be implemented with inverters 263<1>, 263<3>, and 263<4> and a transfer gate 263<2>. The inverter 263<1> may inversely buffer the drive enable signal BEN to output the inversely buffered signal of the drive enable signal BEN. The transfer gate 263<2> may be turned on when the drive enable signal BEN is enabled to a logic "high" level to receive the transfer data TD. The inverters 263<3> and 263<4> may inversely buffer an output signal of the transfer gate 263<2> to generate latch data LD. The inverters 263<3> and 263<4> may latch the latch data LD.

The transfer circuit 261_5 may be implemented with inverters 265<1> and 265<2> and a transfer gate 265<3>. The inverter 265<1> may inversely buffer the first transfer control signal TCON<1> to output the inversely buffered signal of the first transfer control signal TCON<1>. The inverter 265<2> may inversely buffer the latch data LD to output the inversely buffered signal of the latch data LD. The transfer gate 265<3> may be turned on when the first transfer control signal TCON<1> is enabled to a logic "high" level to output an output signal of the inverter 265<2> as the internal data ID.

The first write driver 261a may be set as a circuit that is driven when the first column address CAD<1> is enabled. The second to sixteenth write drivers (not illustrated) included in the write driver (261 of FIG. 6) might only receive the second to sixteenth column addresses CAD<2:16> instead of the first column address CAD<1>, and are implemented with the same circuits as the first write driver 261a and perform the same operations. Therefore, a detailed description thereof will be omitted here.

Figure 8:
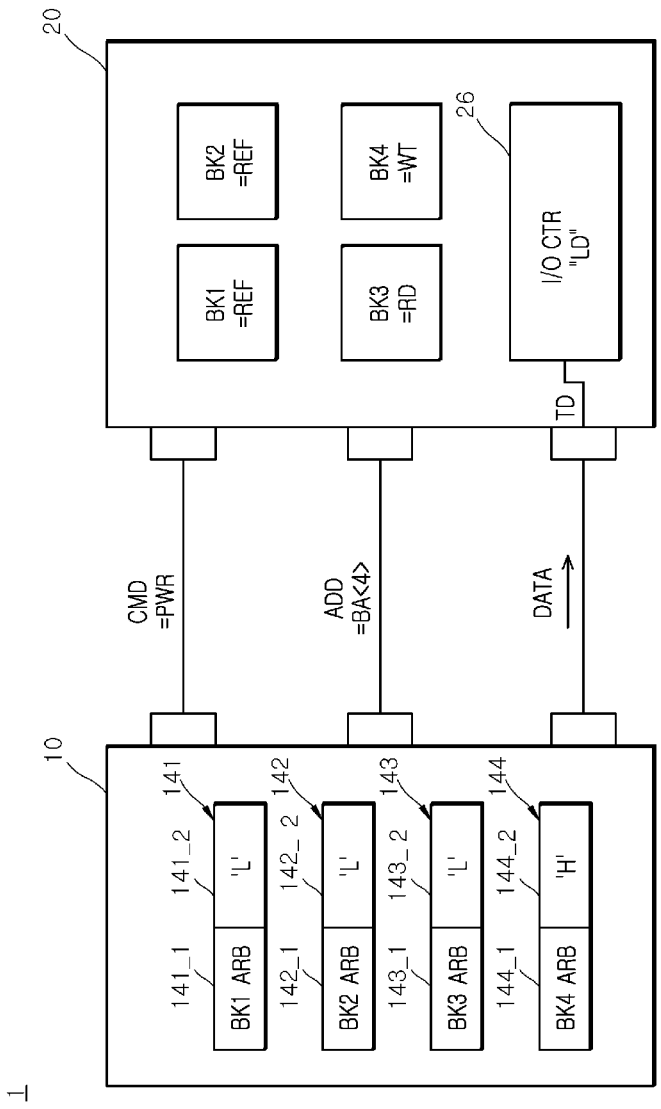
FIGS. 8 and 9 are diagrams illustrating an operation of an electronic system according to an embodiment of the present disclosure.
Figure 9:
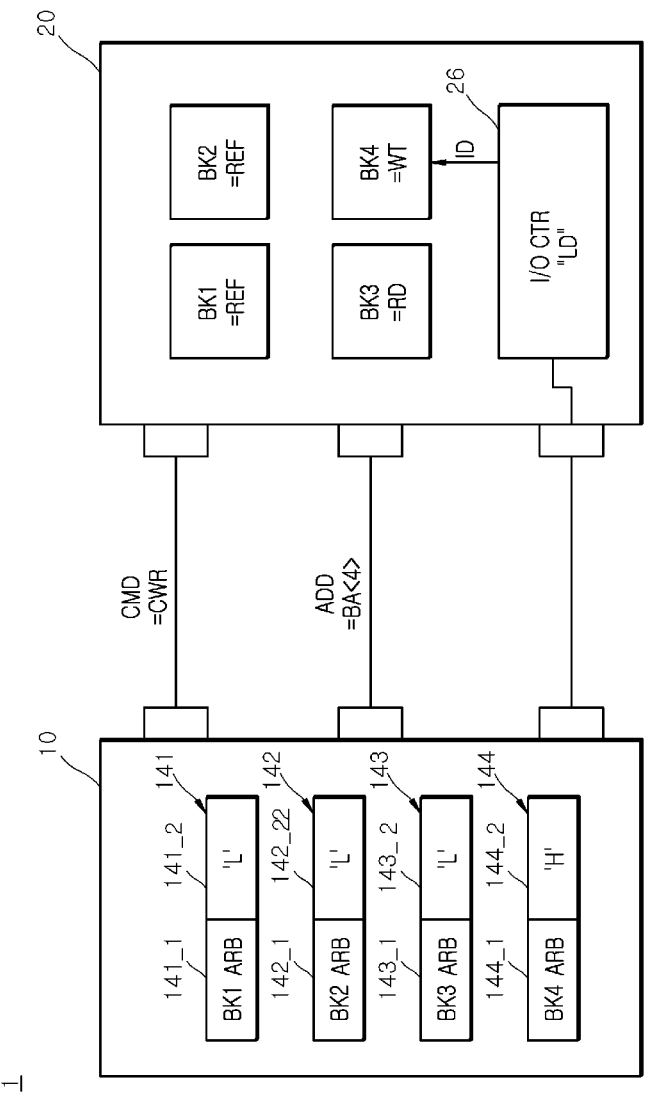

FIGS. 8 and 9 are diagrams illustrating a post-write operation and a core operation of an electronic system 1 according to an embodiment of the present disclosure.

First, the post-write operation of the electronic system 1 will be described with reference to FIG. 8, and a case in which refresh operations for the first to fourth banks BK1, BK2, BK3, BK4 are sequentially performed, the third bank BK3 is in a read operation standby state, and the fourth bank BK4 is in a write operation standby state will be described as an example.

A first arbiter 141_1 of a first bank arbiter 141 may detect a write operation standby for the first bank BK1. A first flag signal generation circuit 141_2 may generate a first flag signal FLAG1 that is disabled to a logic "low" level when a refresh operation on the first bank BK1 is performed in the first arbiter 141_1.

A second arbiter 142_1 of a second bank arbiter 142 may detect a write operation standby for the second bank BK2. A second flag signal generation circuit 142_2 may generate a second flag signal FLAG2 that is disabled to a logic "low" level when a refresh operation on the second bank BK2 is performed in the second arbiter 142_1.

A third arbiter 143_1 of a third bank arbiter 143 may detect a write operation standby for the third bank BK3. A third flag signal generation circuit 143_2 may generate a third flag signal FLAG3 that is disabled to a logic "low" level when the third bank BK3 is in a read operation standby state in the third arbiter 143_1.

A fourth arbiter 144_1 of a fourth bank arbiter 144 may detect a write operation standby for the fourth bank BK4. A fourth flag signal generation circuit 144_2 may generate a fourth flag signal FLAG4 that is enabled to a logic "high" level when the fourth bank BK4 is in a write operation standby state in the fourth arbiter 144_1.

The controller 10 may output a command CMD for performing a post-write operation PWR and an address ADD for generating the fourth bank address BA<4> to the electronic device 20. The controller 10 may output data DATA for performing the post-write operation PWR to the electronic device 20.

The write driver (261 of FIG. 6) of the input/output control circuit 26 may latch the transfer data TD generated from the data DATA by a write control signal WTS, a drive enable signal BEN, and first to sixteen column addresses CAD<1:16> to generate latch data LD during the post-write operation.

Next, a core write operation of the electronic system 1 will be described with reference to FIG. 9, and a case in which refresh operations for the first to fourth banks BK1, BK2, BK3, BK4 are sequentially performed, the third bank BK3 is in a read operation standby state, and the fourth bank BK4 performs a core write operation will be described as an example.

The first arbiter 141_1 of the first bank arbiter 141 may detect a write operation standby for the first bank BK1. The first flag signal generation circuit 141_2 may generate the first flag signal FLAG1 that is disabled to a logic "low" level when the refresh operation on the first bank BK1 is performed in the first arbiter 141_1.

The second arbiter 142_1 of the second bank arbiter 142 may detect a write operation standby for the second bank BK2. The second flag signal generation circuit 142_2 may generate the second flag signal FLAG2 that is disabled to a logic "low" level when the refresh operation on the second bank BK2 is performed in the second arbiter 142_1.

The third arbiter 143_1 of the third bank arbiter 143 may detect a write operation standby for the third bank BK3. The third flag signal generation circuit 143_2 may generate the third flag signal FLAG3 that is disabled to a logic "low" level when the third bank BK3 is in a read operation standby state in the third arbiter 143_1.

The fourth arbiter 144_1 of the fourth bank arbiter 144 may detect a write operation standby for the fourth bank BK4. The fourth flag signal generation circuit 144_2 may generate the fourth flag signal FLAG4 that is enabled to a logic "high" level when the fourth bank BK4 is in a write operation standby state in the fourth arbiter 144_1.

The controller 10 may output the command CMD for performing the core write operation CWR and the address ADD for generating the fourth bank address BA<4> to the electronic device 20. In this case, the controller 10 might not output the data DATA to the electronic device 20.

The write driver (261 of FIG. 6) of the input/output control circuit 26 may output internal data ID generated from the latch data LD generated during the post-write operation by the write control signal WTS, the column control signal CYI, and the first to sixteenth column addresses CAD<1:16> during the core write operation.

The fourth bank BK4 may store the internal data ID via a row path selected by the fourth internal bank address IBA<4> and the first to sixteenth row addresses RAD<1:16>.

The fourth flag signal generation circuit 144_2 of the fourth bank arbiter 144 may generate the fourth flag signal FLAG4 that is disabled to a logic "low" level when the core write operation is performed.

The electronic system 1 according to an embodiment of the present disclosure may detect a bank on which a write operation can be performed during a refresh operation period, perform a post-write operation to latch data, and perform a core write operation after the refresh operation period to store the latched data in the bank, thereby performing additional operations on the bank during the refresh operation. The electronic system 1 may efficiently use the electronic device 20 by latching data to an input/output control circuit connected to the bank of the electronic device capable of post-write operation during the refresh operation period and performing the core write operation of storing the latched data in the bank after the refresh operation period.

Figure 10:
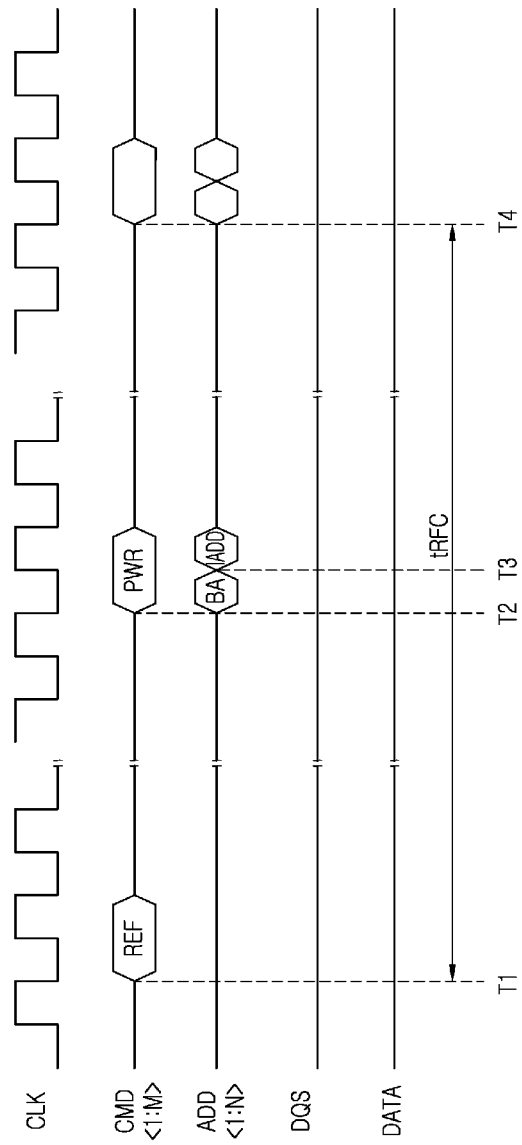
FIGS. 10 to 16 are timing diagrams illustrating an operation of an electronic system according to an embodiment of the present disclosure.

FIG. 10 is a timing diagram illustrating a refresh operation and a post-write operation of an electronic system 1 according to an embodiment of the present disclosure. The operations of the electronic system 1 will be described with reference to FIG. 10 together with FIG. 1.

At a first time point T1, the controller 10 may output first to $M^{th}$ commands CMD<1:M> for performing the refresh operation REF.

At a second time point T2, the controller 10 may output first to $M^{th}$ commands for performing the post write operation PWR. The controller 10 may output first to $N^{th}$ addresses ADD<1:N> for generating bank addresses BAs.

At a third time point T3, the controller 10 may output first $N^{th}$ addresses ADD<1:N> for generating internal addresses IADDs during the post write operation PWR.

At a fourth time point T4, the controller 10 may output first to $M^{th}$ commands for performing another operation of the electronic device 20.

The period from the first time point T1 to the fourth time point T4 may mean a time period tRFC for the refresh operation.

The electronic system 1 according to an embodiment of the present disclosure may perform an additional operation on the bank during the refresh operation by detecting a bank on which the write operation can be performed during the refresh operation period, performing the post-write operation to latch data, and performing a core write operation after the refresh operation period to store the latched data in the bank. The electronic system 1 may latch data in an input/output control circuit connected to the bank of an electronic device on which the post-write operation can be performed during the refresh operation period and perform the core write operation of storing the latched data in the bank after the refresh operation period, so that the electronic device 20 can be used efficiently.

Figure 11:
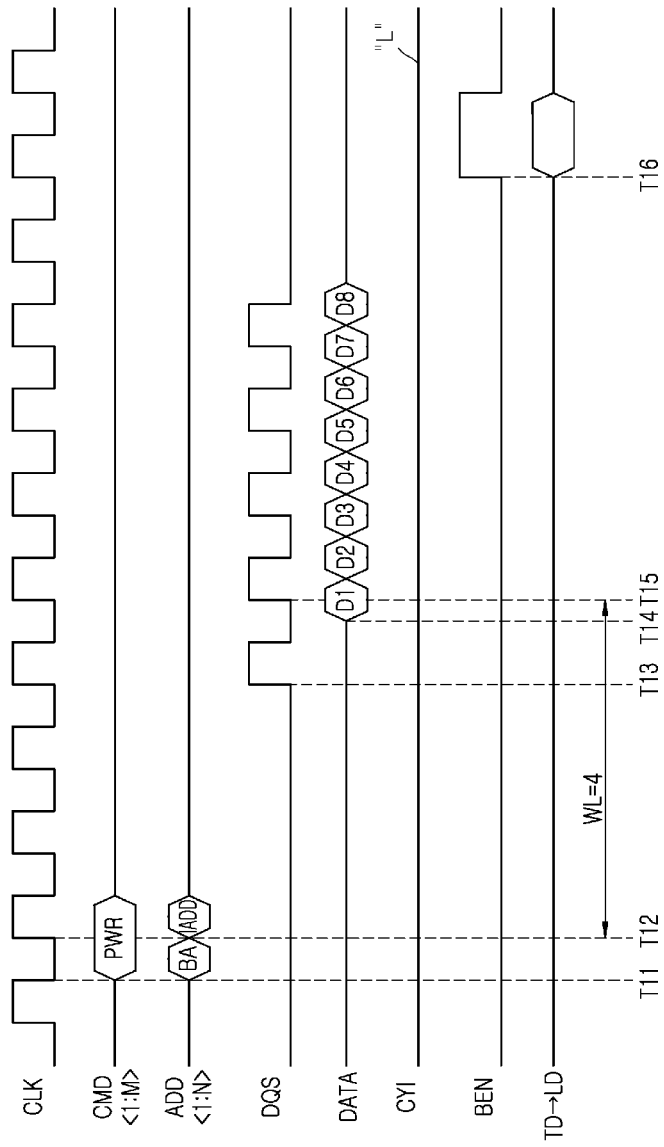

FIG. 11 is a timing diagram illustrating a post-write operation of the electronic system 1 according to an embodiment of the present disclosure. The operation of the electronic system 1 will be described with reference to FIG. 11 together with FIG. 1.

At an eleventh time point T11, the controller 10 may output first to $M^{th}$ commands CMD<1:M> for performing the post-write operation PWR. The controller 10 may output first to $N^{th}$ addresses ADD<1:N> for generating bank addresses BAs during the post-write operation PWR.

At a twelfth time point T12, the controller 10 may output first to $N^{th}$ addresses ADD<1:N> for generating internal addresses IADDs during the post-write operation.

At a thirteenth time point T13, a strobe signal DQS may be toggled to sample the data DATA.

At a fourteenth time point T14, the controller 10 may output the data DATA for performing the post-write operation PWR.

At a fifteenth time point, the serial-to-parallel conversion circuit 28 of the electronic device 20 may sample the data DATA in synchronization with the toggled strobe signal DQS to output the generated transfer data TD by a global input/output line GIO.

At a sixteenth time point, the input/output control circuit 26 may latch the transfer data TD loaded on the global line GIO by the write control signal WTS of a logic "high" level, the drive enable signal BEN of a logic "high" level, the column control signal of a logic "low" level, and first to sixteenth column addresses CAD<1:16> to generate latch data LD.

The period from the twelfth time point T12 to the fifteenth time point T15 may mean a write latency period WL=4, and the write latency period WL=4 may mean that the time period in which the data DATA is input from the input time of the first to $M^{th}$ commands CMD<1:M> for performing the post-write operation PWR is 4 cycles of the clock CLK. The write latency period may be set to a cycle of various clocks CLK according to an embodiment.

Figure 12:
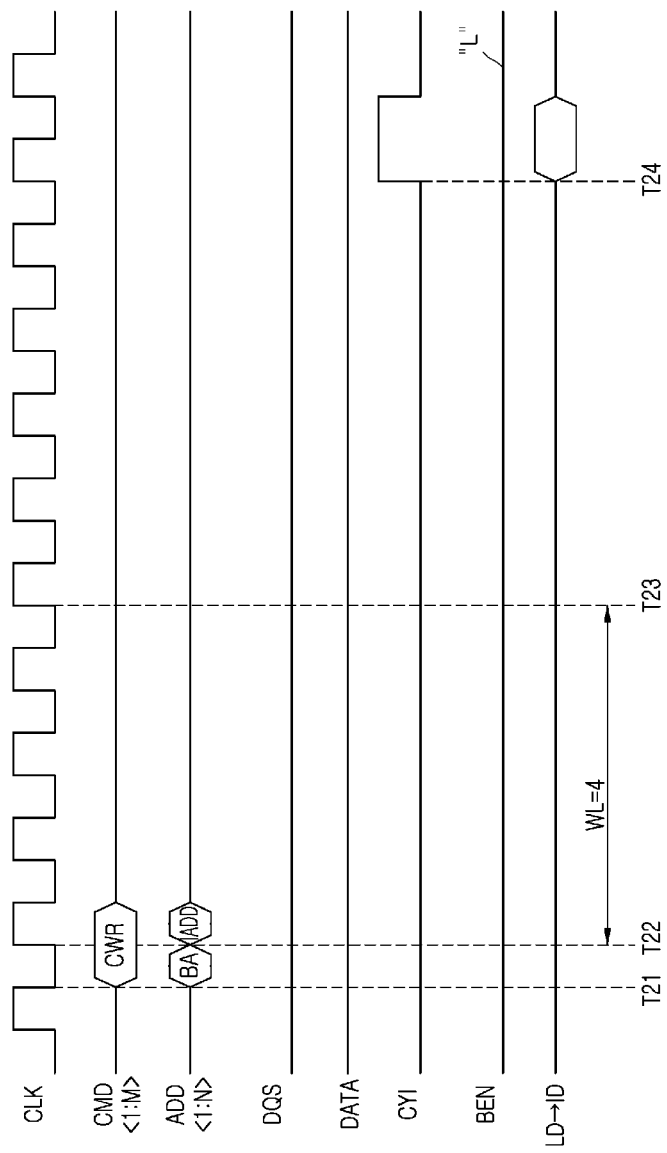

FIG. 12 is a timing diagram illustrating a core write operation of an electronic system 1 according to an embodiment of the present disclosure. The operation of the electronic system 1 will be described with reference to FIG. 12 together with FIG. 1.

Prior to the description, an active operation needs to be performed before the core write operation. Hereinafter, the core write operation performed after the active operation will be described.

At a $21^{st}$ time point T21, the controller 10 may output first to $M^{th}$ commands CMD<1:M> for performing the core write operation CWR. The controller 10 may output first to $N^{th}$ addresses ADD<1:N> for generating bank addresses BAs during the core write operation CWR.

At a $22^{nd}$ time point T22, the controller 10 may output first to $N^{th}$ addresses ADD<1:N> for generating internal addresses IADD during the core write operation CWR.

The period from the $22^{nd}$ time point T22 to a $23^{rd}$ time point T23 may mean the write latency period WL=4 described with reference to FIG. 10. In this case, the strobe signal DQS might not be toggled. The controller 10 might not output data DATA.

At a $24^{th}$ time point T24, the input/output control circuit 26 may generate internal data ID from latch data LD generated in the post-write operation by a write control signal WTS of a logic "high" level, a drive enable signal BEN of a logic "low" level, a column control signal of a logic "high" level, and first to sixteenth column addresses CAD<1:16>. A bank selected from the first to fourth banks BK1, BK2, BK3, and BK4 included in the core region 27 may store the internal data ID.

As described above, the electronic system 1 according to an embodiment of the present disclosure may perform an additional operation on a bank during the refresh operation by detecting the bank on which the write operation can be performed during the refresh operation period, performing a post-write operation to latch data, and performing a core write operation after the refresh operation period to store the latched data in the bank. The electronic system 1 may latch the data to an input/output control circuit connected to the bank of an electronic device, on which the post-write operation can be performed, during the refresh operation period and perform the core write operation of storing the latched data in the bank after the refresh operation period, so that the electronic device 20 can be used efficiently.

Figure 13:
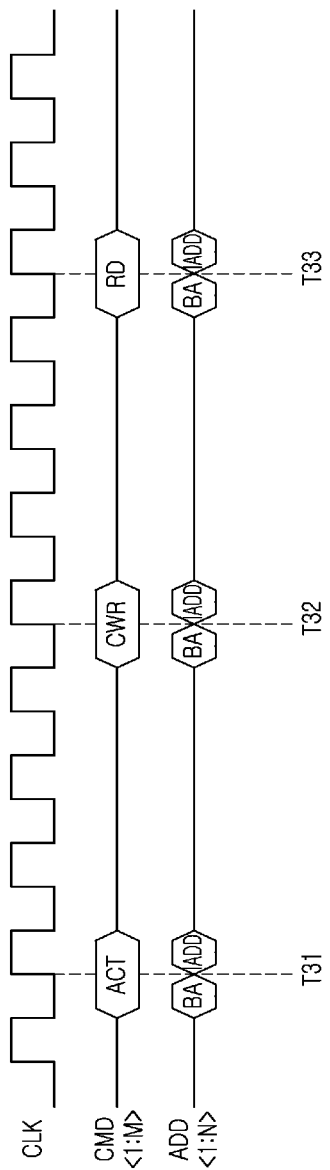

The operations of the electronic system 1 according to an embodiment of the present disclosure will be described with reference to FIG. 13 together with FIG. 1, and FIG. 13 is a timing diagram illustrating a process of performing an active operation, a core write operation, and a read operation of a normal operation.

At a $31^{st}$ time point T31, the controller 10 may output first to $M^{th}$ commands CMD<1:M> and first to $N^{th}$ addresses ADD<1:N> for performing the active operation ACT. The electronic device 20 may receive the first to $M^{th}$ commands CMD<1:M> and the first to $N^{th}$ addresses ADD<1:N> to perform the active operation on a bank selected from the first to fourth banks BK1, BK2, BK3, and BK4.

At a $32^{nd}$ time point T32, the controller 10 may output first to $M^{th}$ commands CMD<1:M> and first to $N^{th}$ addresses ADD<1:N> for performing the core write operation CWR. The electronic device 20 may receive the first to $M^{th}$ commands CMD<1:M> and the first to $N^{th}$ addresses ADD<1:N> to perform the core write operation on the bank selected from the first to fourth banks BK1, BK2, BK3, and BK4. Meanwhile, a time period from the $31^{st}$ time point T31 to the $32^{nd}$ time point T32 may be set to a RAS to CAS delay time tRCD.

At a $33^{rd}$ time point T33, the controller 10 may output first to $M^{th}$ commands CMD<1:M> and first to $N^{th}$ addresses ADD<1:N> for performing the read operation RD of the normal operation. The electronic device 20 may receive the first to $M^{th}$ commands CMD<1:M> and the first to $N^{th}$ addresses ADD<1:N> to perform the read operation of the normal operation on the bank selected from the first to fourth banks BK1, BK2, BK3, and BK4. Meanwhile, a time period from the $32^{nd}$ time point T32 to the $33^{rd}$ time point T33 may be set to a CAS to CAS delay time tCCD.

Figure 14:
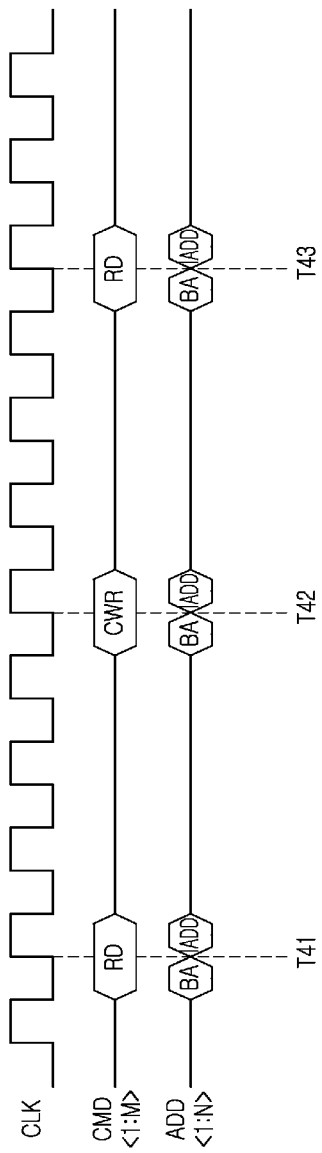

The operation of the electronic system 1 according to an embodiment of the present disclosure will be described with reference to FIG. 14 together with FIG. 1, and FIG. 14 is a timing diagram illustrating a process of performing a read operation of the normal operation, a core write operation, and a read operation of the normal operation.

At a $41^{st}$ time point T41, the controller 10 may output first to $M^{th}$ commands CMD<1:M> and first to $N^{th}$ addresses ADD<1:N> for performing the read operation RD of the normal operation. The electronic device 20 may receive the first to $M^{th}$ commands CMD<1:M> and the first to $N^{th}$ addresses ADD<1:N> to perform the read operation of the normal operation on a bank selected from the first to fourth banks BK1, BK2, BK3, and BK4.

At a $42^{nd}$ time point T42, the controller 10 may output first to $M^{th}$ commands CMD<1:M> and first to $N^{th}$ addresses ADD<1:N> for performing the core write operation CWR. The electronic device 20 may receive the first to $M^{th}$ commands CMD<1:M> and the first to $N^{th}$ addresses ADD<1:N> to perform the core write operation of the normal operation on the bank selected from the first to fourth banks BK1, BK2, BK3, and BK4. Meanwhile, a time period from the $41^{st}$ time point T41 to the $42^{nd}$ time point T42 may be set to a CAS to CAS delay time tCCD.

At a $43^{rd}$ time point T43, the controller 10 may output first to $M^{th}$ commands CMD<1:M> and first to $N^{th}$ addresses ADD<1:N> for performing the read operation of the normal operation. The electronic device 20 may receive the first to $M^{th}$ commands CMD<1:M> and the first to $N^{th}$ addresses ADD<1:N> to perform the read operation of the normal operation on the bank selected from the first to fourth banks BK1, BK2, BK3, and BK4. Meanwhile, a time period from the $42^{nd}$ time point T42 to the $43^{rd}$ time point T43 may be set to a CAS to CAS delay time tCCD.

Figure 15:
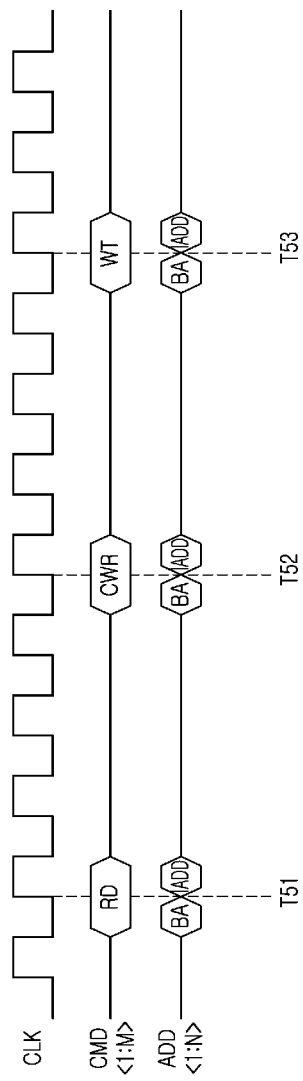

The operation of the electronic system 1 according to an embodiment of the present disclosure will be described with reference to FIG. 15 together with FIG. 1, but FIG. 15 is a timing diagram illustrating a process of performing a read operation of the normal operation, a core write operation, and a write operation of the normal operation.

At a $51^{st}$ time point T51, the controller 10 may output first to $M^{th}$ commands CMD<1:M> and first to $N^{th}$ addresses ADD<1:N> for performing the read operation RD of the normal operation. The electronic device 20 may receive the first to $M^{th}$ commands CMD<1:M> and the first to $N^{th}$ addresses ADD<1:N> to perform the read operation of the normal operation on a bank selected from the first to fourth banks BK1, BK2, BK3, and BK4.

At a $52^{nd}$ time point T52, the controller 10 may output first to $M^{th}$ commands CMD<1:M> and first to $N^{th}$ addresses ADD<1:N> for performing the core write operation CWR. The electronic device 20 may receive the first to $M^{th}$ commands CMD<1:M> and the first to $N^{th}$ addresses ADD<1:N> to perform the core write operation of the normal operation on the bank selected from the first to fourth banks BK1, BK2, BK3, and BK4. Meanwhile, a time period from the $51^{st}$ time point T51 to the $52^{nd}$ time point T52 may be set to a CAS to CAS delay time tCCD.

At a $53^{rd}$ time point T53, the controller 10 may output first to $M^{th}$ commands CMD<1:M> and first to $N^{th}$ addresses ADD<1:N> for performing the write operation of the normal operation. The electronic device 20 may receive the first to $M^{th}$ commands CMD<1:M> and the first to $N^{th}$ addresses ADD<1:N> to perform the write operation of the normal operation on the bank selected from the first to fourth banks BK1, BK2, BK3, and BK4. Meanwhile, a time period from the $52^{nd}$ time point T52 to the $53^{rd}$ time point T53 may be set to a CAS to CAS delay time tCCD.

Figure 16:
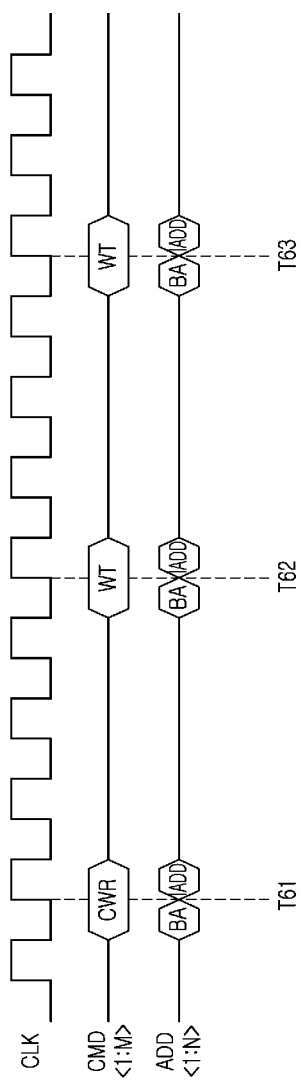

The operation of the electronic system 1 according to an embodiment of the present disclosure will be described with reference to FIG. 16 together with FIG. 1, and FIG. 16 is a timing diagram illustrating a process of performing a core write operation, a write operation of the normal operation, and a write operation of the normal operation.

At a $61^{st}$ time point T61, the controller 10 may output first to $M^{th}$ commands CMD<1:M> and first to $N^{th}$ addresses ADD<1:N> for performing the core write operation CWR. The electronic device 20 may receive the first to $M^{th}$ commands CMD<1:M> and the first to $N^{th}$ addresses ADD<1:N> to perform the core write operation CWR on a bank selected from the first to fourth banks BK1, BK2, BK3, and BK4.

At a $62^{nd}$ time point T62, the controller 10 may output first to $M^{th}$ commands CMD<1:M> and first to $N^{th}$ addresses ADD<1:N> for performing the write operation WT of the normal operation. The electronic device 20 may receive the first to $M^{th}$ commands CMD<1:M> and the first to $N^{th}$ addresses ADD<1:N> to perform the write operation of the normal operation on the bank selected from the first to fourth banks BK1, BK2, BK3, and BK4. Meanwhile, a time period from the $61^{st}$ time point T61 to the $62^{nd}$ time point T62 may be set to a CAS to CAS delay time tCCD.

At a $63^{rd}$ time point T63, the controller 10 may output first to $M^{th}$ commands CMD<1:M> and first to $N^{th}$ addresses ADD<1:N> for performing the write operation WT of the normal operation. The electronic device 20 may receive the first to $M^{th}$ commands CMD<1:M> and the first to $N^{th}$ addresses ADD<1:N> to perform the write operation of the normal operation on the bank selected from the first to fourth banks BK1, BK2, BK3, and BK4. Meanwhile, a time period from the $62^{nd}$ time point T62 to the $63^{rd}$ time point T63 may be set to a CAS to CAS delay time tCCD.

Figure 17:
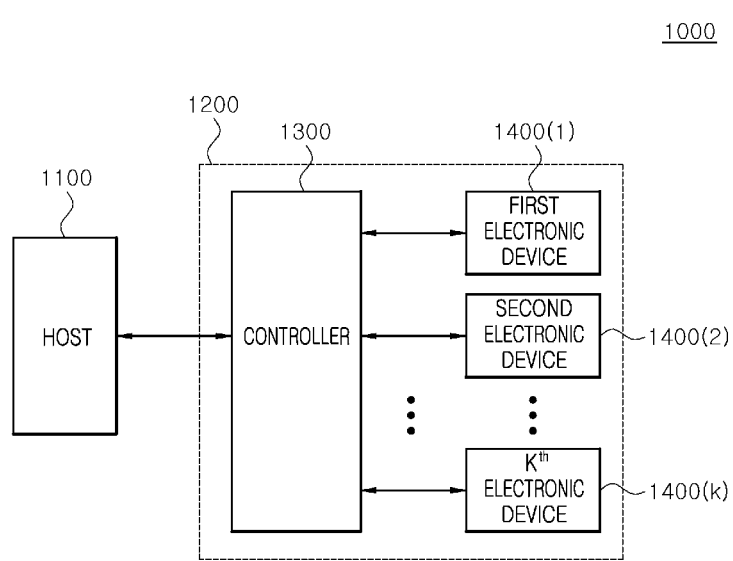
FIG. 17 is a diagram illustrating a configuration according to another embodiment of the electronic system illustrated in FIGS. 1 to 16.

FIG. 17 is a diagram illustrating a configuration according to an example of an electronic system 1000 according to an embodiment of the present disclosure. As illustrated in FIG. 17, the electronic system 1000 may include a host 1100 and a semiconductor system 1200.

The host 1100 and the semiconductor system 1200 may transmit and receive signals to and from each other using interface protocols. The interface protocols used between the host 1100 and the semiconductor system 1200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), or the like.

The semiconductor system 1200 may include a controller 1300 and electronic devices 1400(1:K). The controller 1300 may control the electronic devices 1400(1:K) to perform a refresh operation, a post-write operation, a core write operation, and a normal operation. Each of the electronic devices 1400(1:K) may perform the refresh operation, the post-write operation, the core write operation, and the normal operation. The semiconductor system 1200 may detect a bank on which the write operation can be performed during the refresh operation, perform the post-write operation to latch data, and perform the core write operation after the refresh operation period to store the latched data in the bank, thereby performing an additional operation on the bank during the refresh operation. The semiconductor system 1200 may detect a bank on which the post-write operation can be performed during the refresh operation, perform the post-write operation to latch data, and perform the core write operation after the refresh operation period to store the latched data to the bank, thereby performing an additional operation on the bank during the refresh operation. The semiconductor system 1200 can efficiently use the electronic devices 1400(1:K) by latching data in the input/output control circuit connected to the bank of the electronic device, on which the post-write operation can be performed during the refresh operation period, and performing the core write operation to store the latched data in the bank after the refresh operation period.

The controller 1300 may be implemented as the controller 10 illustrated in FIG. 1. Each of the electronic devices 1400(1:K) may be implemented with one of dynamic random access memory (DRAM), phase change random access memory (PRAM), resistive random access memory (RRAM), magnetic random access memory (MRAM), and ferroelectric random access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An electronic system comprising:
a controller configured to detect a bank in a standby state for a write operation between a first bank and a second bank during a refresh operation period and output data for performing a post-write operation to the bank in the standby state for the write operation; and
an electronic device including the first and second banks, wherein the electronic device is configured to latch the data in an input/output control circuit connected to the bank in the standby state for the write operation.

2. The electronic system of claim 1, wherein the controller is configured to:
output a command for performing the post-write operation during the refresh operation period, and
output a command for performing a core write operation of storing the data latched in the input/output control circuit after the refresh operation period has ended.

3. The electronic system of claim 1, wherein the electronic device is configured to perform the post-write operation on the bank in the standby state for the write operation between the first and second banks when the first and second banks perform the refresh operation.

4. The electronic system of claim 1, wherein the controller comprises:
a command generation circuit configured to output a command for performing the refresh operation and output the command for performing the post-write operation and the core write operation, based on a write control signal;
a refresh control circuit configured to set the refresh operation period;
a write read queue circuit configured to output an address for performing the post-write operation and the core write operation and the data; and
a bank arbiter configured to store corresponding first and second flag signals in the bank in the standby state for the write operation between the first and second banks and control the core write operation, based on the first and second flag signals after the refresh operation period.

5. The electronic system of claim 4, wherein the bank arbiter comprises:
a first bank arbiter configured to store the first flag signal that is enabled when the first bank is in the standby state for the write operation and is disabled when the core write operation on the first bank is performed, during the refresh operation period on the first bank;
a second bank arbiter configured to store the second flag signal that is enabled when the second bank is in the standby state for the write operation and is disabled when the core write operation on the second bank is performed, during the refresh operation period on the second bank; and
a write control signal generation circuit configured to generate the write control signal, based on the first flag signal and the second flag signal.

6. The electronic system of claim 1, wherein the electronic device comprises:
a write read control circuit configured to generate the write control signal and a drive enable signal when a post-write signal is input and generate a column control signal when a core write signal is input;
a row control circuit configured to generate an internal bank address and a row address sequentially counted when a refresh signal is input and generate the internal bank address and the row address from the bank address and an internal address during the post-write operation;
a column control circuit configured to generate a column address from the internal address; and
the input/output control circuit configured to latch the data in a write driver selected from a first write driver and a second write driver by the write control signal, the drive enable signal, and the column address and store the data latched in the write driver selected from the first and second write drivers by the write control signal, the drive enable signal, and the column address in one of the first and second banks.

7. The electronic system of claim 6, wherein the input/output control circuit comprises:
the first write driver configured to latch first transfer data generated from the data as first latch data when the drive enable signal is activated and output the first latch data as internal data when the column control signal and first column address are activated; and
the second write driver configured to latch second transfer data generated from the data as second latch data when the drive enable signal is activated and output the second latch data as the internal data when the column control signal and second column address are activated.

8. The electronic system of claim 7, wherein the first write driver comprises:
a first transfer control signal generation circuit configured to generate first transfer control signal, based on the first column address, the write control signal, and the column control signal;
a first latch circuit configured to receive the transfer data when the drive enable signal is enabled and latch the transfer data to generate the first latch data; and
a first transfer circuit configured to buffer the first latch data to generate the internal data when the first transfer control signal is enabled.

9. The electronic system of claim 7, wherein the second write driver comprises:
a second transfer control signal generation circuit configured to generate second transfer control signal, based on the second column address, the write control signal, and the column control signal;
a second latch circuit configured to receive the transfer data when the drive enable signal is enabled and latch the transfer data to generate the second latch data; and a second transfer circuit configured to buffer the second latch data to generate the internal data when the second transfer control signal is enabled.

10. An electronic system comprising:
a controller configured to output a command for performing a post-write operation and data for performing the post-write operation during a refresh operation period and output a command for performing a core write operation after the refresh operation period; and
an electronic device configured to latch the data in an input/output circuit connected to a bank performing the post-write operation, based on the command during the refresh operation period and store the latched data in the bank after the refresh operation period.

11. The electronic system of claim 10, wherein the electronic device comprises a first bank and a second bank,
wherein the electronic device is configured to perform the post-write operation on a bank in a standby state for a write operation when the first and second banks perform the refresh operation to latch the data in the input/output control circuit, and
wherein the electronic device is configured to store the latched data in the bank in a standby state for the write operation during the core write operation period after the refresh operation period.

12. The electronic system of claim 10, wherein the controller comprises:
a command generation circuit configured to output the command for performing the refresh operation and output the command for performing the post-write operation and the core write operation, based on a write control signal;
a refresh control circuit configured to set the refresh operation period;
a write read queue circuit configured to output an address for performing the post-write operation and the core write operation and the data; and
a bank arbiter configured to store corresponding first and second flag signals in the bank in the standby state for the write operation between the first and second banks and control the core write operation, based on the first and second flag signals after the refresh operation period.

13. The electronic system of claim 12, wherein the command generation circuit is configured to output the command for performing the post-write operation and the core write operation when the write control signal is disabled, and
wherein the command generation circuit is configured to output the command for performing a normal operation when the write control signal is enabled.

14. The electronic system of claim 12, wherein the bank arbiter comprises:
a first bank arbiter configured to store the first flag signal that is enabled when the first bank is in the standby state for the write operation during the refresh operation period on the first bank and is disabled when the core write operation on the first bank is performed;
a second bank arbiter configured to store the second flag signal that is enabled when the second bank is in the standby state for the write operation during the refresh operation period on the second bank and is disabled when the core write operation on the second bank is performed; and
a write control signal generation circuit configured to generate the write control signal, based on the first flag signal and the second flag signal.

15. The electronic system of claim 10, wherein the electronic device comprises:
a write read control circuit configured to generate the write control signal and a drive enable signal when a post-write signal is input and generate a column control signal when a core write signal is input;
a row control circuit configured to generate an internal bank address and a row address sequentially counted when a refresh signal is input and generate the internal bank address and the row address from a bank address and an internal address during the post-write operation;
a column control circuit configured to generate a column address from the internal address; and
the input/output control circuit configured to latch the data in a write driver selected from a first write driver and a second write driver by the write control signal, the drive enable signal, and the column address and store the data latched in the write driver selected from the first and second write drivers by the write control signal, the drive enable signal, and the column address in one of the first and second banks.

16. The electronic system of claim 15, wherein the input/output control circuit comprises:
the first write driver configured to latch first transfer data generated from the data as first latch data when the drive enable signal is activated and output the first latch data as internal data when the column control signal and first column address are activated; and
the second write driver configured to latch second transfer data generated from the data as second latch data when the drive enable signal is activated and output the second latch data as internal data when the column control signal and second column address are activated.

17. The electronic system of claim 16, wherein the first write driver comprises:
a first transfer control signal generation circuit configured to generate a first transfer control signal, based on the first column address, the write control signal, and the column control signal;
a first latch circuit configured to receive the transfer data when the drive enable signal is enabled and latch the transfer data to generate the first latch data; and
a first transfer circuit configured to buffer the first latch data when the first transfer control signal is enabled to generate the internal data.

18. The electronic system of claim 16, wherein the second write driver includes:
a second transfer control signal generation circuit configured to generate a second transfer control signal, based on the second column address, the write control signal, and the column control signal;
a second latch circuit configured to receive the transfer data when the drive enable signal is enabled and latch the transfer data to generate the second latch data; and
a second transfer circuit configured to buffer the second latch data when the second transfer control signal is enabled to generate the internal data.

19. An electronic system comprising:
a controller configured to detect a bank in a standby state for a write operation, output a command and data for performing a post-write operation during a refresh operation period, and output a command for performing a core write operation to the bank in the standby state for the write operation after the refresh operation period has ended; and
an electronic device configured to latch the data to an input/output control circuit connected to the bank in the standby state for the write operation when the post-write operation is performed, based on the command during the refresh operation period, and store the data latched in the input/output control circuit in the bank in the standby state for the write operation, based on the command when the core write operation is performed.

20. The electronic system of claim 19, wherein the controller is configured to output a command for performing a normal operation after the core write operation is performed, and wherein the electronic device is configured to input/output the data, based on the command and address during a normal operation period.

* * * * *